United States Patent
Lee et al.

(10) Patent No.: US 7,929,358 B2
(45) Date of Patent: Apr. 19, 2011

(54) DATA OUTPUT CIRCUIT

(75) Inventors: Jun-Woo Lee, Gyeonggi-do (KR); Dae-Han Kwon, Gyeonggi-do (KR); Taek-Sang Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 155 days.

(21) Appl. No.: 12/327,397

(22) Filed: Dec. 3, 2008

(65) Prior Publication Data

US 2010/0061157 A1 Mar. 11, 2010

(30) Foreign Application Priority Data

Sep. 10, 2008 (KR) .................. 10-2008-0089299

(51) Int. Cl.
*G11C 7/10* (2006.01)
(52) U.S. Cl. ................... 365/189.05; 365/219; 365/221; 365/230.08; 365/233.1
(58) Field of Classification Search ............. 365/189.05, 365/230.08, 233.1, 219, 221
See application file for complete search history.

(56) References Cited

U.S. PATENT DOCUMENTS

| 6,990,596 B2 * | 1/2006 | Polizzi et al. ................. 713/400 |
| 7,684,260 B2 * | 3/2010 | Ko ............................ 365/189.05 |
| 2008/0225603 A1 * | 9/2008 | Hein ....................... 365/189.05 |
| 2009/0201746 A1 * | 8/2009 | Morzano et al. ......... 365/189.05 |

FOREIGN PATENT DOCUMENTS

| JP | 07-014388 | 1/1995 |
| JP | 08-124380 | 5/1996 |

OTHER PUBLICATIONS

Notice of Allowance issued from Korean Intellectual Property Office on Feb. 26, 2010.

* cited by examiner

*Primary Examiner* — Pho M Luu
(74) *Attorney, Agent, or Firm* — IP & T Group LLP (57) ABSTRACT

A data output circuit includes a serial data output unit for outputting a plurality of parallel data as serial data according to an operation mode, an internal information output unit for outputting internal information data according to the operation mode, and a buffering unit for receiving the serial data and the internal information data through an identical input end and buffering the received data.

19 Claims, 6 Drawing Sheets

DATA OUTPUT CIRCUIT

CROSS-REFERENCE TO RELATED APPLICATIONS

This application claims priority to Korean patent application number 10-2008-0089299, filed on Sep. 10, 2008, which is incorporated by reference in its entirety.

BACKGROUND OF THE INVENTION

The present subject matter relates to a semiconductor design technology, and more particularly, to a data output circuit for outputting internal information data such as a vendor ID through an input/output pad.

In general, a semiconductor memory device such as a double data rate synchronous DRAM (DDR SDRAM) provides internal information data to an external device such as a chip set through an input/output pad. For example, the internal information data includes a vender ID for identifying a manufacturing company of a semiconductor memory device, and the semiconductor memory device includes a register for storing such a vender ID. If a semiconductor memory device includes additional pads for outputting a vender ID, the number of pads increases as many as the additional pads, and a manufacturing cost thereof increases, too. Therefore, the vender ID is outputted through an input/output pad.

Figure 1:
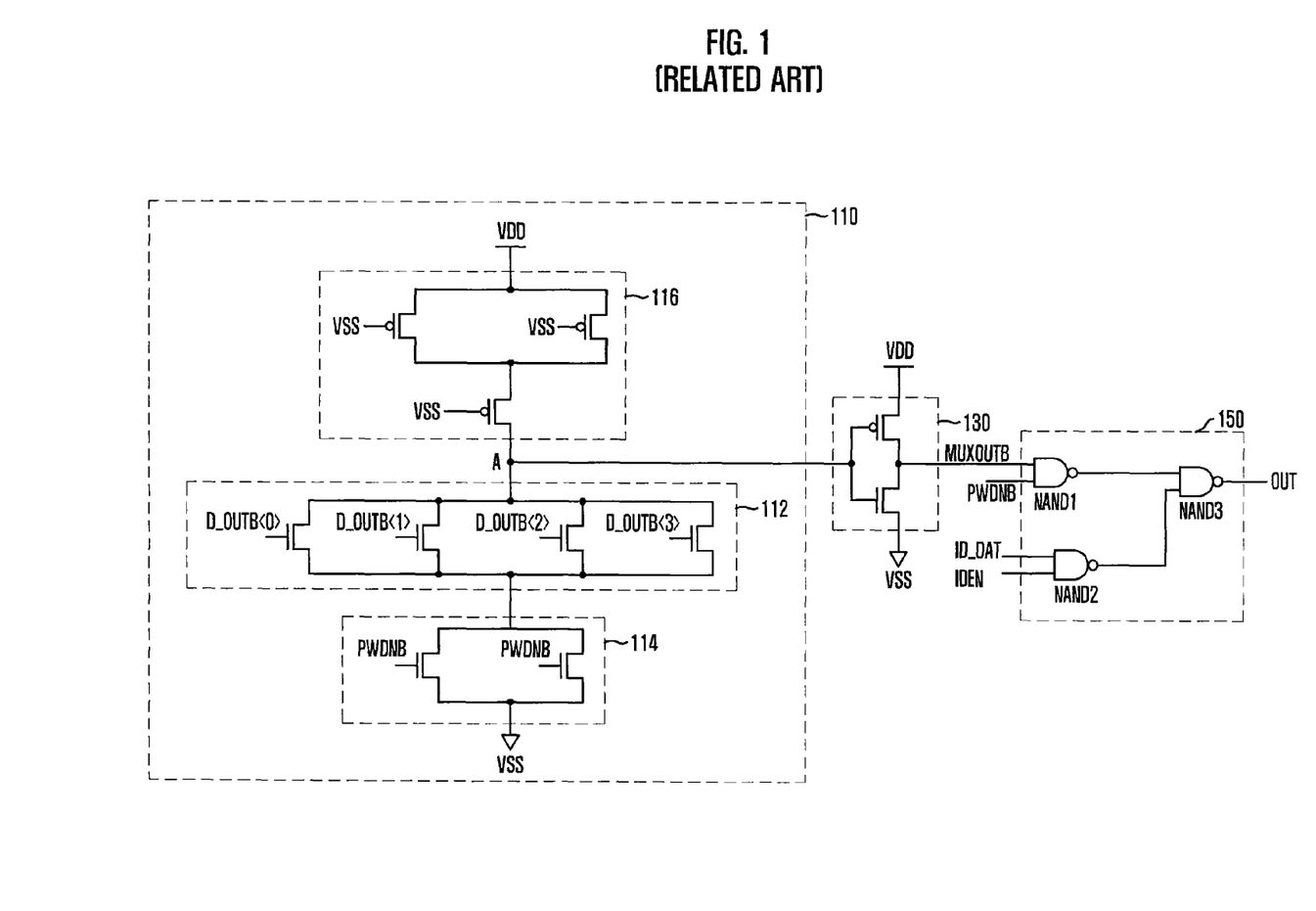
FIG. 1 is a circuit diagram illustrating a data output circuit of the related art.

FIG. 1 is a circuit diagram illustrating a data output circuit according to the related art.

Referring to FIG. 1, the data output circuit includes a serial data output unit 110, a buffer 130, and a data selection and output unit 150.

The serial data output unit 110 serializes $0^{th}$ to $3^{rd}$ output data D_OUTB<0:3> which are parallel data and outputs serial data MUXOUTB. Here, the serial data output unit 110 includes an internal data input unit 112, an activation unit 114, and a power supply unit 116.

The internal data input unit 112 receives $0^{th}$ to $3^{rd}$ output data D_OUTB<0:3>. The internal data input unit 112 includes a plurality of NMOS transistors for receiving each of $0^{th}$ to $3^{rd}$ output data D_OUTB<0:3>.

The activation unit 114 controls an activation operation of the internal data input unit 112 in response to a sub power down mode signal PWDNB. The activation unit 114 includes a plurality of NMOS transistors disposed between the internal data input unit 112 and a ground power supply end VSS. The sub power down mode signal PWDNB is a signal activated in a mode to minimize power used in a semiconductor memory device. Such a mode is referred to as a power down mode, hereinafter.

The power supply unit 116 supplies power to an output node A and includes a plurality of PMOS transistors connected between an external power supply end VDD and the output node A.

The buffer 130 buffers a signal generated at the output node A and outputs the buffered signal as serial data MUXOUTB.

The data selection and output unit 150 outputs serial data MUXOUTB or vender ID data ID_DAT to an output end OUT in response to the sub power down mode signal PWDNB and a main ID activation signal IDEN. Data outputted to the output end OUT is outputted to an input/output pad (not shown) through a pre-driver (not shown) and a main driver (not shown).

The sub power down mode signal PWDNB becomes a logic 'high' in a read operation mode and becomes a logic 'low' in the power down mode. The main ID activation signal IDEN becomes a logic 'high' in a mode to output a vender ID (hereinafter, an ID output mode), and becomes a logic 'low' in the other modes except the ID output mode. In general, the ID output mode is performed in the power down mode. In other words, the data selection output unit 150 outputs the serial data MUXOUTB to the output end OUT in the read operation mode and outputs the vender ID data ID_DAT to the output end OUT in the ID output mode.

Hereinafter, a problem of a data output circuit according to the related art will be described as follows.

The data output circuit according to the related art includes a data selection and output unit 150 for selectively outputting the serial data MUXOUTB and the vender ID data ID_DAT through one input/output pad (not shown). While the data selection and output unit 150 includes first to third NAND gates NAND1, NAND2, and NAND3, the first NAND gate NAND1 and the second NAND gate NAND2 operates as loading with respect to the serial data MAXOUTB. Such loading may be a factor that deteriorates high speed operation in outputting the serial data MUXOUTB to the input/output pad. Furthermore, the higher the operation frequency of the semiconductor memory device becomes, the more timing jitter increases due to inter symbol interference (ISI).

SUMMARY OF THE INVENTION

Embodiments of the present subject matter are directed to providing a data output circuit that shares an output end for outputting internal data and outputs the internal information data through the output end.

Embodiments of the present subject matter are directed to providing a data output circuit for outputting data and internal information data through one input/output pad and minimizing loading reflected to outputting data.

In accordance with an aspect of the disclosure, there is provided a data output circuit which includes a serial data output unit configured to output a plurality of parallel data as serial data according to an operation mode, an internal information output unit configured to output internal information data according to the operation mode, and a buffering unit configured to receive the serial data and the internal information data through an identical input end and buffer the received data.

In accordance with another aspect of the disclosure, there is provided a semiconductor memory device which includes a plurality of synchronizers configured to synchronize a plurality of parallel data to multiphase phase clock signals, an internal information output unit configured to receive internal information data and output the received internal information data to an output node according to an operation mode, and a serial data output unit configured to receive power in response to the internal information data, serialize output signals of the plurality of synchronizers according to the operation mode, and output the serialized signal to the output node.

A semiconductor memory device according to the related art was designed to selectively output serial data and vender ID data through different output ends. It becomes unnecessary loading in view of the serial data. A semiconductor memory device according to the present invention is designed to output vender ID data through an output end that outputs serial data. Therefore, the semiconductor memory device according to the present invention can output the serial data at a high speed.

DESCRIPTION OF SPECIFIC EMBODIMENTS

Other objects and advantages of the present subject matter can be understood by the following description, and become apparent with reference to the embodiments of the present invention.

Figure 2:
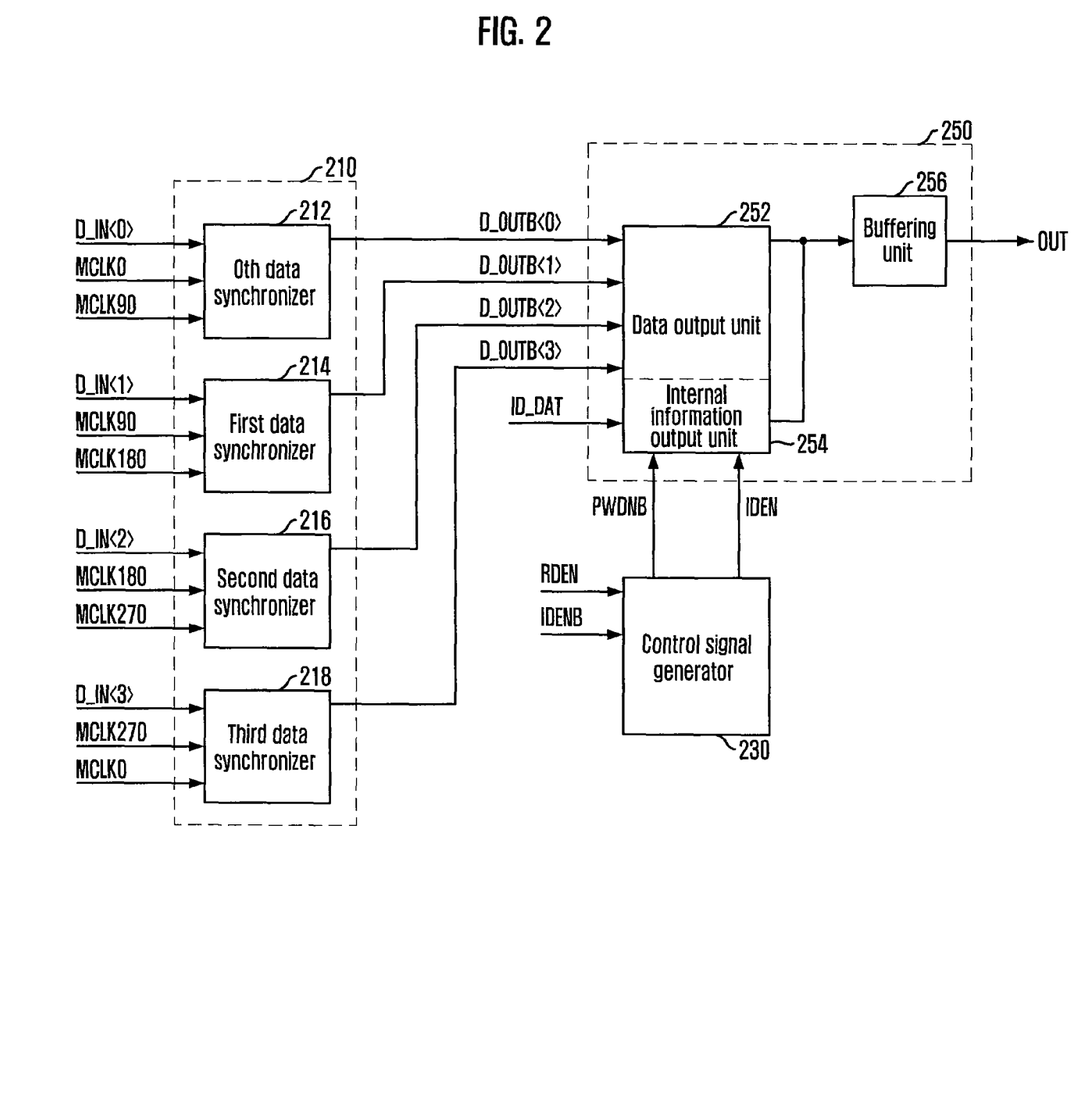
FIG. 2 is a block diagram illustrating a part of a semiconductor memory device in accordance with an embodiment of the present subject matter.

FIG. 2 is a block diagram illustrating a part of a semiconductor memory device in accordance with an embodiment of the present invention.

Referring to FIG. 2, the semiconductor memory device according to the present embodiment includes a data synchronizing unit 210, a control signal generator 230, and a data output unit 250. The data output unit 250 serializes a plurality of parallel data D_IN<0:3> and outputs the serialized data according to an operation mode. The data output unit 250 may receive and output the vender ID data ID_DAT.

The data synchronizing unit 210 synchronize a plurality of parallel data D_IN<0:3> to multiphase clock signals MCLK0, MCLK90, MCLK180, and MCLK270. The data synchronizing unit 210 includes $0^{th}$ to $3^{rd}$ data synchronizers 212, 214, 216, and 218. $0^{th}$ to $3^{rd}$ phase clock signals MCLK0, MCLK90, MCLK180, and MCLK270, which are the multiphase clock signal, are signals having a predetermined phase difference with each other. For example, each of the $0^{th}$ to $3^{rd}$ phase clock signals MCLK0, MCLK90, MCLK180, and MCLK270 has a 90••phase difference.

The $0^{th}$ data synchronizer 212 synchronizes the $0^{th}$ internal data D_IN<0> among the plurality of parallel data to the $0^{th}$ phase clock signal MCLK0 and the first phase clock signal MCLK90 and outputs the $0^{th}$ output signal D_OUTB<0>. The $1^{st}$ data synchronizer 214 synchronizes the $1^{st}$ internal data D_IN<1> among the plurality of parallel data to the $1^{st}$ phase clock signal MCLK90 and the $2^{nd}$ phase clock signal MCLK180 and outputs the $1^{st}$ output signal D_OUTB<1>. The $2^{nd}$ data synchronizer 216 synchronizes the $2^{nd}$ internal data D_IN<2> among the plurality of parallel data to the $2^{nd}$ phase clock signal MCLK180 and the $3^{rd}$ phase clock signal MCLK270 and outputs the $2^{nd}$ output signal D_OUTB<2>. The $3^{rd}$ data synchronizer 218 synchronizes the $3^{rd}$ internal data D_IN<3> among the plurality of parallel data to the $3^{rd}$ phase clock signal MCLK270 and the $0^{th}$ phase clock signal MCLK0 and outputs the $3^{rd}$ output signal D_OUTB<3>.

Figure 3:
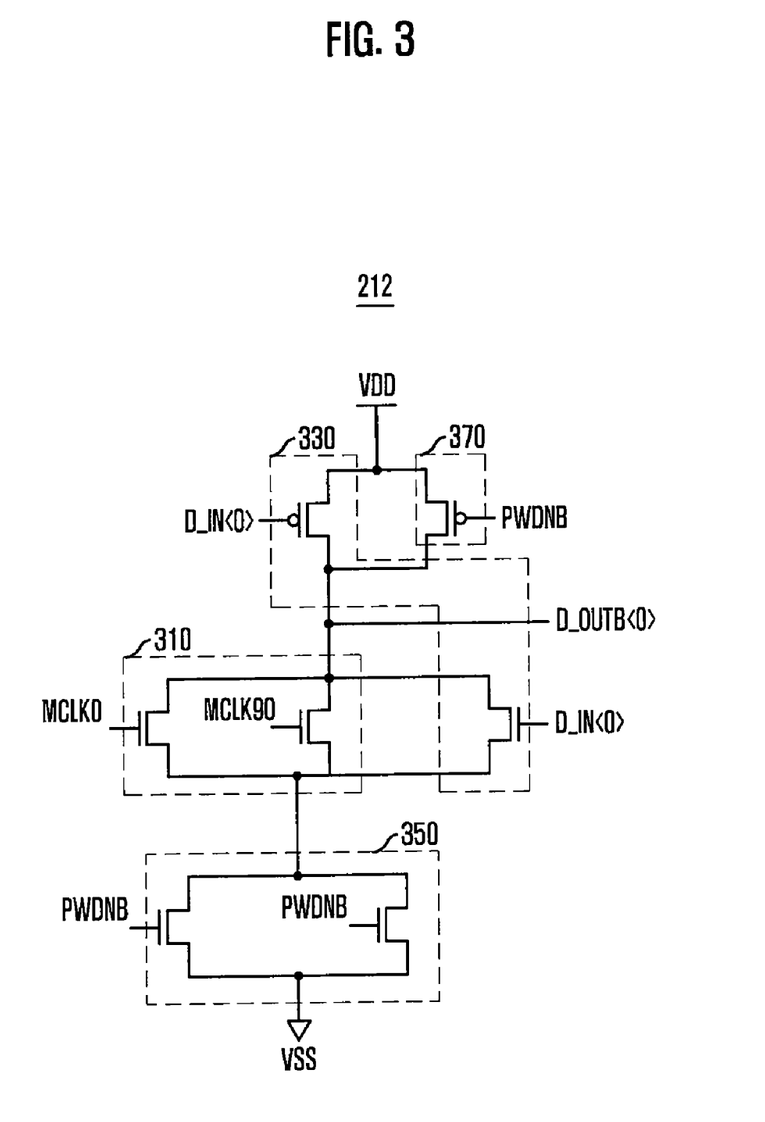
FIG. 3 is a circuit diagram illustrating a $0^{th}$ data synchronizer 212 of FIG. 2.

FIG. 3 is a circuit diagram illustrating a $0^{th}$ data synchronizer 212 of FIG. 2.

Referring to FIG. 3, the $0^{th}$ data synchronizer 212 includes a clock input unit 310, a data input driver 330, a set operation controller 350, and a reset operation controller 370.

The clock input unit 310 receives the $0^{th}$ phase clock signal MCLK0 and the $1^{st}$ phase clock signal MCLK90 and performs a synchronizing operation between the $0^{th}$ internal data D_IN<0> and the $0^{th}$ and $1^{st}$ phase clock signals MCLK0 and MCLK90. A NMOS transistor in the clock input unit 310 may perform a turn-on operation or a turn-off operation in response to the $0^{th}$ and $1^{st}$ phase clock signals MCLK0 and MCLK90.

The data input driver 330 receives the $0^{th}$ internal data, drives an output end, and outputs the $0^{th}$ output data D_OUTB<0>. The data input driver 330 may perform a pull up operation or a pull down operation to the output end in response to the $0^{th}$ internal data D_IN<0>.

The set operation controller 350 sets the $0^{th}$ data synchronizer 212 in response to a sub power down mode signal PWDNB. The $0^{th}$ data synchronizer 212 may perform a synchronizing operation in response to the sub power down mode signal PWDNB. The sub power down mode signal PWDNB will be described later with a control signal generator 230.

The reset operation controller 370 resets the $0^{th}$ data synchronizer 212 in response to the sub power down mode signal PWDNB and may perform a pre-charging operation of an output end in response to the sub power down mode signal PWDNB.

Referring back to FIG. 2, since the $1^{st}$ to $3^{rd}$ data synchronizers 214, 216, and 218 have a circuit configuration identical to that of the $0^{th}$ data synchronizer 212, the detail description thereof is omitted. Unlike the $0^{th}$ data synchronizer 212, the $1^{st}$ to $3^{rd}$ data synchronizes 214, 216, and 218 receive corresponding internal data and phase clock signal and output corresponding data as shown in FIG. 2.

Figure 4:
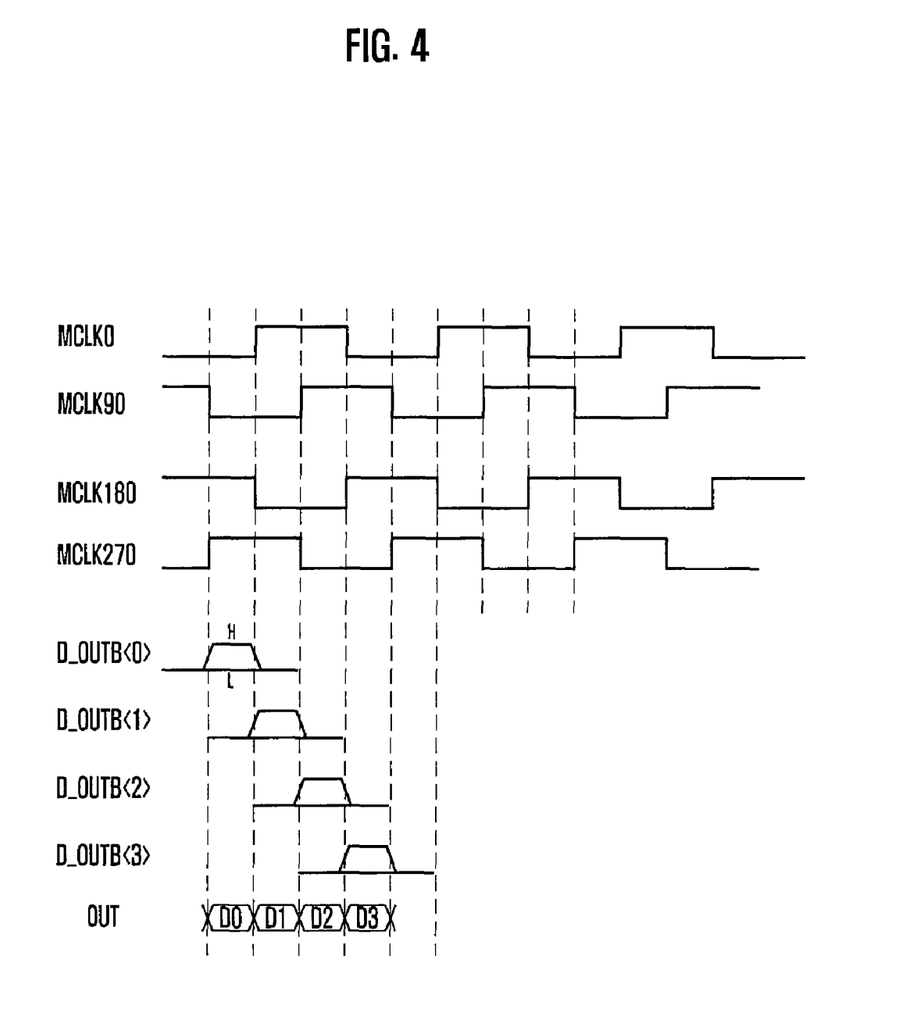
FIG. 4 is a waveform showing operations of $0^{th}$ to $3^{rd}$ data synchronizers 212, 214, 216, and 218 of FIG. 2.

FIG. 4 is a waveform showing operations of $0^{th}$ to $3^{rd}$ data synchronizers 212, 214, 216, and 218 of FIG. 2. For convenience, it is assumed that the sub power down mode signal is a logic 'high' when the $0^{th}$ data synchronizer 212 of FIG. 3 is in a set operation state in response to the sub power down mode signal PWDNB.

Referring to FIGS. 2 to 4, the multiphase clock signals, that is, the $0^{th}$ to $3^{rd}$ phase clock signals MCLK0, MCLK90, MCLK180, and MCLK270 may have a predetermined phase difference between each other, for example, a 90••phase difference.

A NMOS transistor in the clock input unit 310 of FIG. 3 may be turned off in a period when the $0^{th}$ phase clock signal MCKL0 and the $1^{st}$ phase clock signal MCLK90 are in a logic 'low.' The output end of the $0^{th}$ data synchronizer 212 has a logical 'high' value or a logical 'low' value according to the $0^{th}$ internal data D_IN<0>. That is, the $0^{th}$ internal data D_IN<0> is synchronized when the $0^{th}$ and $1^{st}$ phase clock signals are logical 'low,' and the synchronized data is outputted as the $0^{th}$ output data D_OUTB<0>.

Such a synchronization operation is identically performed in the $1^{st}$ to $3^{rd}$ data synchronizers 214, 216, and 218. Therefore, the first to third internal data D_IN<1>, D_IN<2>, and D_IN<3> are synchronized with corresponding phase clock signals and outputted as the first to third output data D_OUTB<1>, D_OUTB<2>, and D_OUTB<3>. Finally, the $0^{th}$ to $3^{rd}$ output data D_OUTB<0:3> are synchronized with the $0^{th}$ to $3^{rd}$ phase clock signals MCLK0, MCLK90, MCLK180, and MCLK270 and outputted sequentially.

Referring back to FIG. 2, the control signal generator 230 generates a sub power down mode signal PWDNB and a main ID activation signal IDEN in response to a read instruction signal RDEN that is activated in the read operation mode and in response to a sub ID activation signal IDENB that is activated in an ID output mode.

Figure 5:
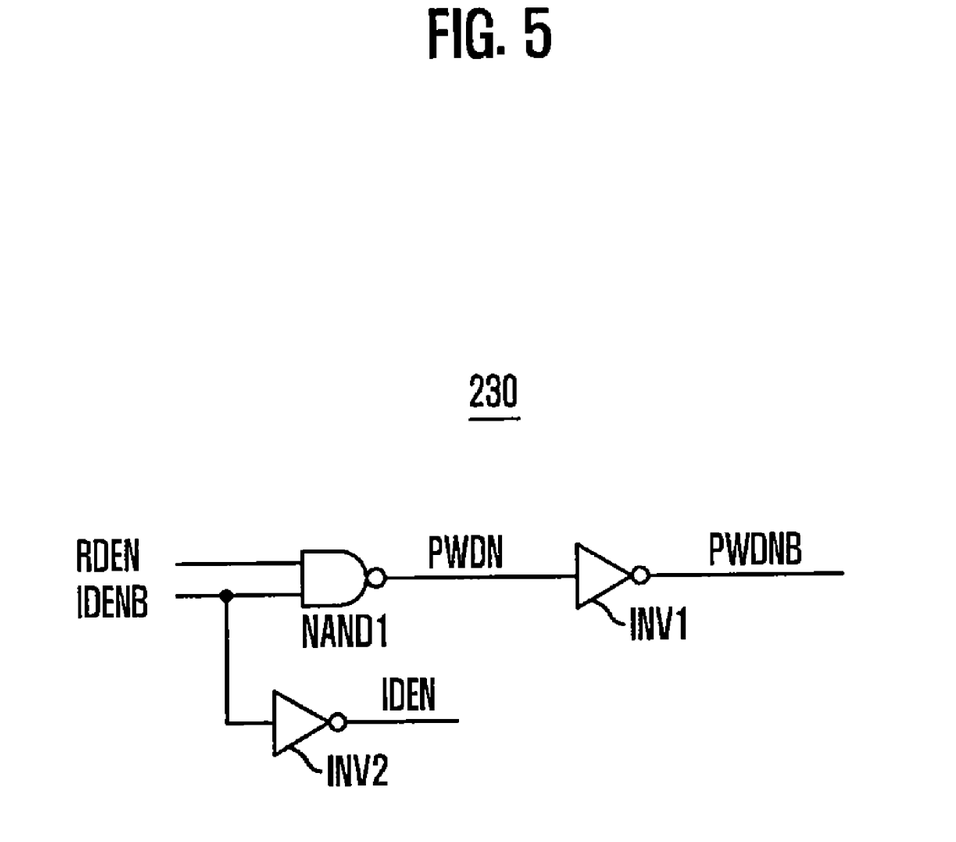
FIG. 5 is a circuit diagram illustrating a control signal generator 230 of FIG. 2.

FIG. 5 is a circuit diagram illustrating a control signal generator 230 of FIG. 2.

Referring to FIG. 5, the control signal generator 230 may include a first NAND gate NAND1 for receiving a read instruction signal RDEN and a sub ID activation signal IDENB and outputting a main power down mode signal PWDN, a first inverter INV1 for receiving and inversing the main power down mode signal PWDN and outputting a sub power down mode signal PWDNB, and a second inverter INV2 for receiving and inversing the sub ID activation signal IDENB and outputting the main ID activation signal IDEN.

The read instruction signal RDEN becomes a logic 'high' in the read operation mode and becomes a logic 'low' in the power down mode. The sub ID activation signal IDENB becomes a logic 'low' in the ID output mode and becomes a logic 'high' in other modes except the ID output mode.

Therefore, the main power down mode signal PWDN becomes a logic 'low' in the read operation mode. The sub power down mode signal PWDNB becomes a logic 'high' in the read operation mode. The main ID activation signal IDEN becomes a logic 'high' in the ID output mode. The ID output mode may be performed in the power down mode. Therefore, the main power down mode signal PWDN becomes a logic 'high,' and the sub power down mode signal PWDNB becomes a logic 'low' in the ID output mode.

Referring back to FIG. 2, the data output unit 250 includes a serial data output unit 252, an internal information output unit 254, and a buffering unit 256.

The serial data output unit 252 serializes a plurality of output data D_OUTB<0:3> in the read operation mode and outputs the serialized data. In the ID output mode, the internal information output unit 254 outputs a signal corresponding to a vender ID data ID_DAT in response to the vender ID data ID_DAT which is an internal information signal. The buffering unit 256 receives the serial data outputted from the serial data output unit 252 and the output signal of the internal information output unit 254 through the identical input end A in FIG. 6 and buffers the received data.

The output signal of the buffering unit 256 may be outputted to an input/output pad (not shown) through an output driver having a pre-driver (not shown) and a main driver (not shown).

Figure 6:
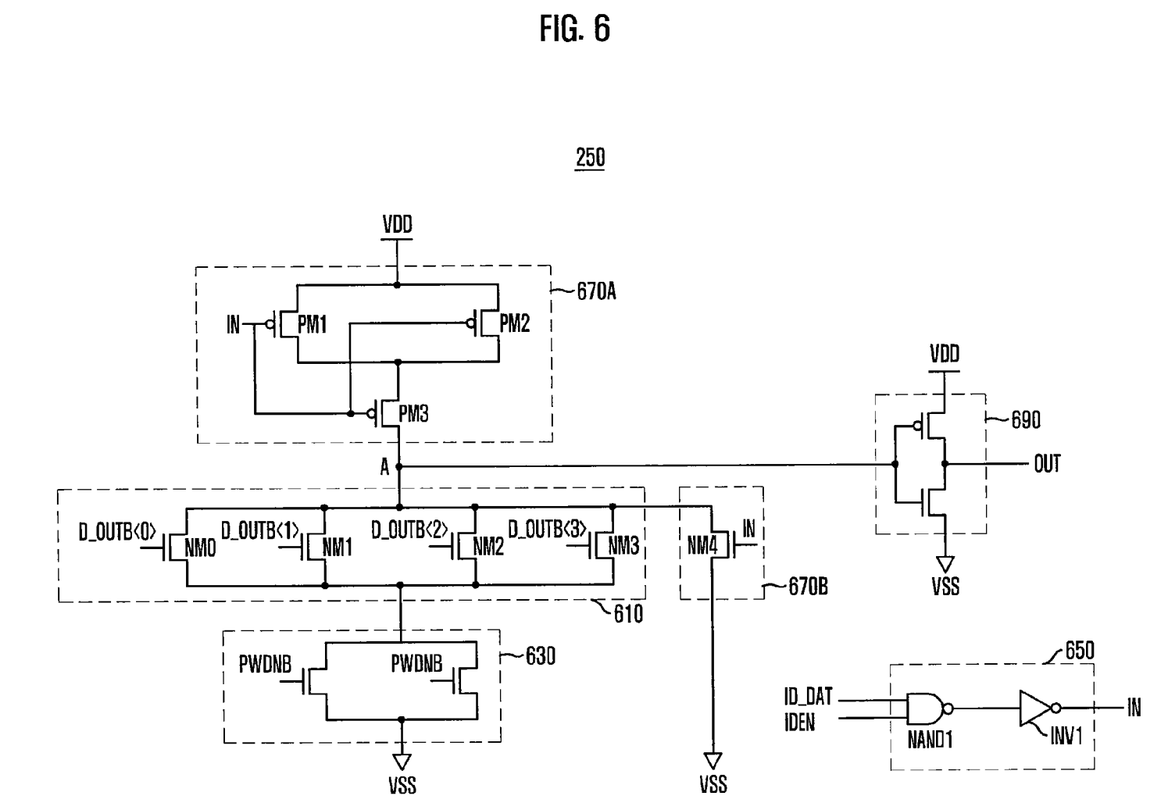
FIG. 6 is a circuit diagram illustrating a data output unit 250 of FIG. 2.

FIG. 6 is a circuit diagram illustrating a data output unit 250 of FIG. 2.

Referring to FIG. 6, the data output unit 250 includes an internal data input unit 610, an activation unit 630, an ID data transfer unit 650, ID data input units 670A and 670B, and a buffering unit 690. The internal data input unit 610 and the activation unit 630 may be equivalent to the serial data output unit 252 of FIG. 2, and the ID data input units 670A and 670B may be equivalent to the internal information output unit 254 of FIG. 2. The internal data input unit 610 may receive power from a pull up driver 670A that is activated in response to the vender ID data ID_DAT. In this case, the pull up driver 670A operates in the serial data output unit 252.

The internal data input unit 610 receives $0^{th}$ to $3^{rd}$ output data D_OUTB<0:3>. The internal data input unit 610 includes $0^{th}$ to $3^{rd}$ NMOS transistors NM0, NM1, NM2, and NM3 for receiving $0^{th}$ to $3^{rd}$ output data D_OUTB<0:3>, respectively. The $0^{th}$ to $3^{rd}$ NMOS transistors NM0, NM1, NM2, and NM3 may perform a turn-on operation or a turn-off operation according to the inputted $0^{th}$ to $3^{rd}$ output data D_OUTB<0:3>.

The activation unit 630 controls the activation operation of the internal data input unit 610 in response to the sub power down mode signal PWDNB. The activation unit 630 is connected between the internal data input unit 610 and the ground supply voltage end VSS and activated in response to the sub power down mode signal PWDNB.

The ID data transfer unit 650 provides the vender ID data ID_DAT to the ID data input units 670A and 670B in response to the main ID activation signal IDEN. The ID data transfer unit 650 includes a first NAND gate NAND1 for receiving the vender ID data ID_DAT and the main ID activation signal INEN and a first inverter INV1 for inverting the output signal of the first NAND gate NAND1 and outputting an input signal IN.

The input signal IN outputted from the ID data transfer unit 650 according to the present embodiment has a logical value corresponding to the vender ID data ID_DAT in the ID output mode. In the other modes, the input signal IN has a logical 'low' value. Due to such a feature of the input signal IN, the output node A may be driven corresponding to the vender ID data ID_DAT and is applied with external supply voltage corresponding to the read operation mode and the power down mode.

The ID data input unit performs a pull up operation or a pull down operation to the output node A in response to the input signal A. The ID data input unit may include a pull up driver 670A and a pull down driver 670B.

The pull up driver 670A drives the output node A with an external supply voltage in response to the input signal IN. The pull up driver 670A includes first to third PMOS transistors PM1, PM2, and PM3, which form a source-drain path between the external supply voltage end VDD and the output node A and receive the input signal IN through a gate. The pull down driver 670B drives the output node A with a ground supply voltage in response to the input signal IN. The pull down driver 670B includes a fourth NMOS transistor NM4 for forming a source-drain path between the output node A and the ground supply voltage VSS and receives the input signal IN through a gate.

The pull up driver 670A of the semiconductor memory device according to the present embodiment may perform two operations by the input signal IN as described above. That is, the pull up driver 670A performs a pull up operation corresponding to the vender ID data ID_DAT in the ID output mode, and performs an operation for supplying power to the output node A in the read operation mode or the power down mode.

The buffering unit 690 outputs a signal generated at the output node A to the output end OUT. Here, a signal outputted from the output end OUT may be serial data or vender ID data according to an operation mode.

Hereinafter, operations of the data output unit 250 according to the present embodiment will be described with reference to FIGS. 5 and 6.

At first, the read operation mode will be described.

In the read operation mode, the sub power down mode signal PWDNB becomes a logic 'high' and the main ID activation signal IDEN becomes a logic 'low.' Therefore, the $0^{th}$ to $3^{rd}$ output data D_OUTB<0:3> are sequentially inputted to the $0^{th}$ to $3^{rd}$ NMOS transistors NM0, NM1, NM2, and NM3 of the internal data input unit 610, and the buffering unit 690 drives the output end OUT in response to the output node A. Finally, serial data D0, D1, D2, and D3 may be outputted to the output end OUT as shown in FIG. 4.

The ID output mode will be described.

In the ID output mode, the main ID activation signal IDEN may become a logic 'high.' The vender ID data ID_DAT may be inputted to the ID data input units 670A and 670B as the input signal IN. Therefore, the output node A performs a pull up operation or a pull down operation in response to the input signal IN. Finally, the vender ID data ID_DAT may be outputted to the output end OUT. At this time, since the sub power down mode signal PWDNB becomes a logic 'low,' the output node A is not influenced although the $0^{th}$ to $3^{rd}$ output data D_OUTB<0:3> are inputted to the internal data input unit 610.

The semiconductor memory device according to the present embodiment has a structure that shares the identical output node A that outputs data according to the operation mode. Therefore, the semiconductor memory device according to the present embodiment does not require the data selection and output unit 170 which were required in the semiconductor memory device according to the related art. That is, the output node A is driven in response to the $0^{th}$ to $3^{rd}$ output data D_OUTB<0:3> as an input end of the buffer unit 690, and the same output node A is driven in response to the vender ID data ID_DAT in the semiconductor memory device according to the present embodiment. Therefore, loading can be minimized in outputting the serial data D0, D1, D2, and D3. That is, it is possible to guarantee high speed operation of the serial data D0, D1, D2, and D3.

Although the semiconductor memory device according to the present embodiment does not include the data selection and output unit 170, the semiconductor memory device according to the present embodiment can output data corresponding to the serial data D0, D1, D2, and D3 or the vender ID data ID_DAT through one input/output pad according to an operation mode.

Although the vender ID for identifying a manufacturing company of a semiconductor memory device is used as internal information data in the present embodiment, the present subject matter is not limited thereto. That is, the present subject matter can be applied to output information requested from an external circuit.

Furthermore, the logical gates and transistors can be differently embodied in locations and types according to the polarity of signals inputted to the logical gate and the transistor.

Embodiments of the present invention relate to a data output circuit for outputting internal information data through an input/output pad. The data output circuit according to the present embodiment provides an environment for outputting data at high speed by minimizing loading that is reflected in outputting data. Therefore, it is possible to remove timing jitter that is generated by ISI when a semiconductor memory device operates at high speed.

While the present subject matter has been described with respect to the specific embodiments, it will be apparent to those skilled in the art that various changes and modifications may be made without departing from the spirit and scope of the invention as defined in the following claims.

What is claimed is:

1. A data output circuit, comprising:
   a serial data output unit configured to output a plurality of parallel data as serial data according to an operation mode;
   an internal information output unit configured to output internal information data according to the operation mode; and
   a buffering unit configured to receive the serial data and the internal information data through an identical input end and buffer the received data.

2. The data output circuit of claim 1, further comprising an output driver configured to receive an output signal of the buffering unit and output the received output signal to a pad.

3. The data output circuit of claim 1, wherein the serial data output unit includes:
   an input unit configured to receive the plurality of parallel data and output the plurality of parallel data to the output node; and
   a power supply unit configured to supply power to the output node in response to the internal information data.

4. The data output circuit of claim 1, wherein the internal information output unit includes:

a first driver configured to perform a pull up operation on the output node in response to the internal information data; and
   a second driver configured to perform a pull down operation on the output node in response to the internal information data.

5. The data output circuit of claim 4, wherein the first driver is activated according to the operation mode and supplies power to the data output unit.

6. The data output circuit of claim 1, wherein the plurality of parallel data are synchronized with multiphase clock signals.

7. The data output circuit of claim 1, wherein the internal information data is vender ID information.

8. A semiconductor memory device, comprising:
   a plurality of synchronizers configured to synchronize a plurality of parallel data to multiphase phase clock signals;
   an internal information output unit configured to receive internal information data and output the received internal information data to an output node according to an operation mode; and
   a serial data output unit configured to receive power in response to the internal information data, serialize output signals of the plurality of synchronizers according to the operation mode, and output the serialized signal to the output node.

9. The semiconductor memory device of claim 8, further comprising a transfer unit configured to transfer the internal information data to the internal information output unit and the serial data output unit according to the operation mode.

10. The semiconductor memory device of claim 9, wherein the transfer unit outputs a signal corresponding to the internal information data in an internal information output mode for outputting the internal information data and outputs a signal for activating the power supply unit in the other modes.

11. The semiconductor memory device of claim 10, wherein the other modes are a read operation mode and a power down mode.

12. The semiconductor memory device of claim 10, further comprising a control signal generator configured to generate a control signal for controlling the transfer unit corresponding to the operation mode.

13. The semiconductor memory device of claim 8, further comprising:
   a buffering unit configured to buffer the output node; and
   an output driver configured to output an output signal of the buffering unit to a pad.

14. The semiconductor memory device of claim 13, wherein the internal information output unit and the serial data output unit share an input end of the buffering unit.

15. The semiconductor memory device of claim 8, wherein the serial data output unit includes:
   an input unit configured to receive output signals of the plurality of synchronizers and output the output signals to the output node; and
   a power supply unit configured to supply power to the output node in response to the internal information data.

16. The semiconductor memory device of claim 8, wherein the internal information output unit includes:
   a first driver configured to perform a pull up operation on the output node in response to the internal information data; and
   a second driver configured to perform a pull down operation on the output node in response to the internal information data.

17. The semiconductor memory device of claim 16, wherein the first driver is activated according to the operation mode an supplies power to the data output unit.

18. The semiconductor memory device of claim 8, wherein the internal information data is vender ID information.

19. The semiconductor memory device of claim 8, wherein each of the multiphase clock signals has a predetermined phase difference with the other.

* * * * *